United States Patent
Lee et al.

(10) Patent No.: US 11,398,266 B1
(45) Date of Patent: Jul. 26, 2022

(54) INTEGRATED ASSEMBLIES HAVING MEMORY CELLS WITH CAPACITIVE UNITS AND REFERENCE-VOLTAGE-GENERATORS WITH RESISTIVE UNITS

(71) Applicant: Micron Technology, Inc., Boise, ID (US)

(72) Inventors: Hyunui Lee, Kanagawa (JP); Takamasa Suzuki, Tokyo (JP); Yasuo Satoh, Ibaraki (JP); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/144,461

(22) Filed: Jan. 8, 2021

(51) Int. Cl.
| | |
|---|---|
| *G11C 5/14* | (2006.01) |
| *G11C 11/4074* | (2006.01) |
| *G11C 11/4091* | (2006.01) |
| *G11C 11/4063* | (2006.01) |
| *G11C 11/4099* | (2006.01) |
| *H01L 27/108* | (2006.01) |
| *G11C 5/06* | (2006.01) |

(52) U.S. Cl.
CPC ...... *G11C 11/4074* (2013.01); *G11C 11/4063* (2013.01); *G11C 11/4091* (2013.01); *G11C 11/4099* (2013.01); *H01L 27/10802* (2013.01); *G11C 5/063* (2013.01)

(58) Field of Classification Search
CPC ..... G11C 5/147; G11C 5/063; G11C 11/4074; G11C 11/4091
See application file for complete search history.

(56) References Cited

U.S. PATENT DOCUMENTS

| 5,459,684 A * | 10/1995 | Nakamura | G11C 11/4074 365/201 |
| 6,687,150 B1 * | 2/2004 | Joachim | G11C 11/22 365/210.14 |
| 9,595,323 B1 | 3/2017 | Chen et al. | |
| 10,607,988 B2 * | 3/2020 | Karda | H01L 21/845 |
| 10,867,671 B1 | 12/2020 | Hamada et al. | |
| 2006/0077740 A1 | 4/2006 | Lee et al. | |
| 2009/0016100 A1 | 1/2009 | Jeong | |
| 2014/0192588 A1 * | 7/2014 | Lee | G11C 11/5678 365/148 |
| 2015/0085561 A1 * | 3/2015 | Maeda | G11C 16/20 365/148 |
| 2019/0088322 A1 * | 3/2019 | Pyo | G11C 11/1673 |
| 2019/0164985 A1 | 3/2019 | Lee et al. | |
| 2020/0051659 A1 * | 2/2020 | Matsubara | G11C 29/832 |
| 2021/0249416 A1 * | 8/2021 | Li | H01L 27/10808 |

* cited by examiner

*Primary Examiner* — Mushfique Siddique
(74) *Attorney, Agent, or Firm* — Wells St. John P.S.

(57) ABSTRACT

Embodiments include an integrated assembly having a deck over a base, and having memory cells supported by the deck. Each of the memory cells includes a capacitive unit and a transistor. The individual capacitive units of the memory cells each have a storage node electrode, a plate electrode, and a capacitor dielectric material between the storage node electrode and the plate electrode. A reference-voltage-generator includes resistive units supported by the deck. The resistive units are similar to the memory cells but include interconnecting units in place of the capacitive units. The interconnecting units of some adjacent resistive units are shorted to one another.

14 Claims, 13 Drawing Sheets

US 11,398,266 B1

INTEGRATED ASSEMBLIES HAVING MEMORY CELLS WITH CAPACITIVE UNITS AND REFERENCE-VOLTAGE-GENERATORS WITH RESISTIVE UNITS

TECHNICAL FIELD

Integrated assemblies. Reference-voltage-generators. Multi-deck assemblies.

BACKGROUND

Integrated circuits may utilize reference voltages for numerous applications. For example, reference voltages may be coupled with capacitor plates, shield lines, data sense amplifiers, etc.

It may be desired to generate a reference voltage (VREF) in a suitable manner so that the reference voltage is accurate and controllable. An example reference-voltage-generator 1000 is described with reference to FIG. 1.

The reference-voltage-generator 1000 includes a number of resistive components 1002 arranged in series between a VDD supply terminal 1004 and a VSS supply terminal 1006. The resistive components are coupled through switches 1008 to a feed line 1010 associated with a gain buffer 1012. The VREF is output from the gain buffer.

The switches 1008 may be utilized to control how many of the resistive components 1002 are electrically coupled to the feed line 1012, and thus to control the VREF output from the gain buffer 1012.

A continuing goal during the fabrication of integrated assemblies is to increase packing density and to thereby conserve valuable semiconductor real estate. It is desired to develop improved reference-voltage-generators (also referred to as reference-voltage-generation-circuitry) which may be packed into a tighter footprint relative to conventional reference-voltage-generators.

BRIEF DESCRIPTION OF THE DRAWINGS

FIG. 3B-1 is a diagrammatic schematic view representing the example reference-voltage-generator of FIG. 3B.

FIG. 3C-1 is a diagrammatic schematic view representing the example reference-voltage-generator of FIG. 3C.

FIG. 4B-1 is a diagrammatic schematic view representing the example reference-voltage-generator of FIG. 4B.

FIG. 4C-1 is a diagrammatic schematic view representing the example reference-voltage-generator of FIG. 4C.

DETAILED DESCRIPTION OF THE ILLUSTRATED EMBODIMENTS

Some embodiments include reference-voltage-generators configured to be incorporated into multi-deck integrated assemblies in arrangements which conserve valuable semiconductor real estate along base levels of the assemblies. Example embodiments are described with reference to FIGS. 2-4.

Figure 2:
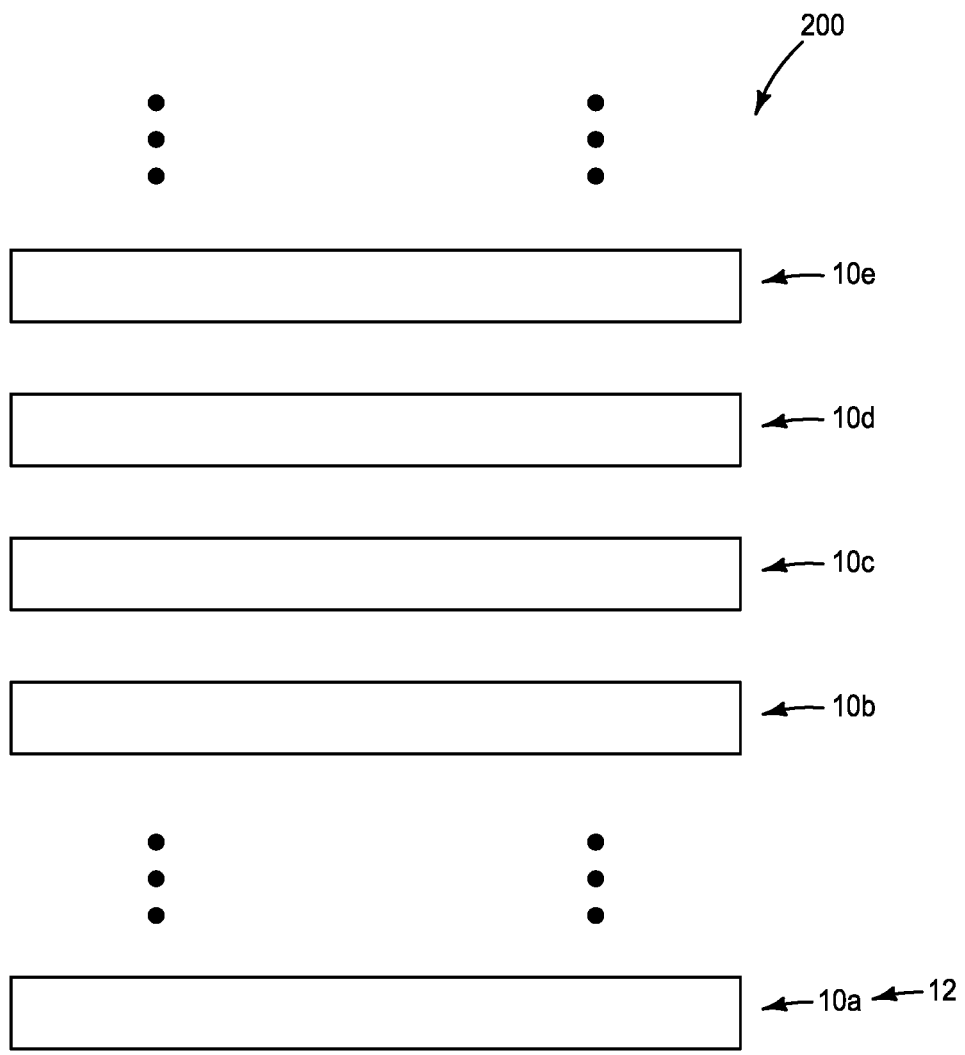
FIG. 2 is a diagrammatic side view of an example multi-deck assembly.

Referring to FIG. 2, an example multi-deck (multi-tier, multi-level) assembly 200 is illustrated. The assembly comprises a vertically-stacked arrangement of tiers (levels, decks) 10a-e. The vertically-stacked arrangement may include any suitable number of the tiers, and may include fewer than the shown number of tiers or more than the shown number of tiers. Generally, the multi-tier arrangement will include at least two of the tiers.

The tiers 10a-e may be within different semiconductor dies, or at least two of the tiers may be within the same semiconductor die.

The bottom tier (10a) may include control circuitry and/or sensing circuitry (e.g., may include wordline drivers, sense amplifiers, etc.), and in some applications may comprise CMOS circuitry. The upper tiers (tiers 10b-e) may include memory arrays. The memory arrays within the various tiers may be the same as one another (e.g., may all be DRAM arrays), or may be different relative to one another (e.g., some may be DRAM arrays, while others are NAND arrays). Also, one or more of the upper tiers may include control circuitry or other logic circuitry.

In some embodiments, the bottom tier 10a may correspond to a semiconductor base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

In some embodiments, the tier 10b is a memory tier (memory deck) comprising a large number of memory cells (e.g., hundreds, thousands, hundreds of thousands, millions, etc.). In some embodiments, a reference-voltage-generator (not shown in FIG. 2) may be configured to have an upper portion along the tier 10b and a lower portion along the base 12 (the tier 10a). The portion along the tier 10b may include resistive units (elements, components) which are similar to the memory cells within the memory tier 10b, and in some embodiments may be considered to be modified memory cells. Example reference-voltage-generators are shown in FIGS. 3B, 3C, 3D, 4B and 4C.

Figure 3A:
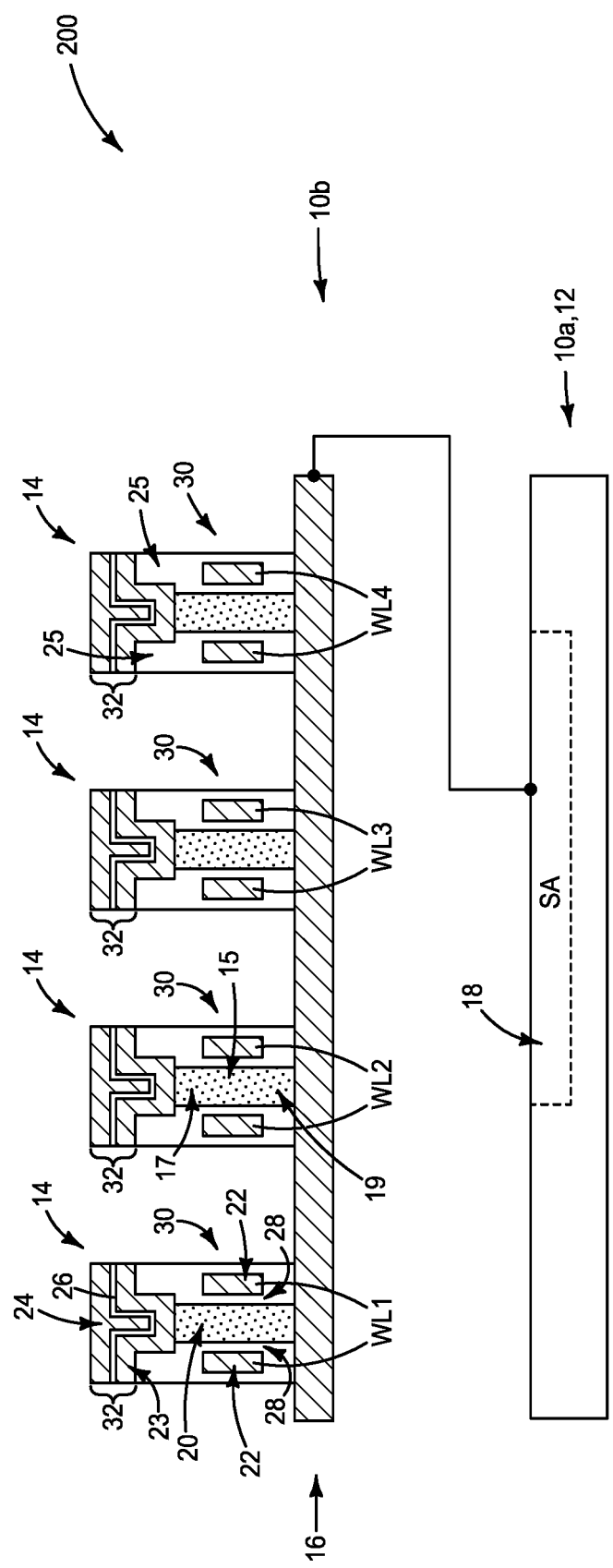
FIG. 3A is a diagrammatic side view of an example arrangement of memory cells within a multi-deck assembly.

Before describing an example reference-voltage-generator, it is useful to describe an arrangement of memory cells within a multi-deck assembly. FIG. 3A shows a region of the example multi-deck assembly 200 of FIG. 2 comprising example memory cells, with the shown region comprising the base 12 (tier 10a) and the tier 10b over the base 12.

A digit line 16 extends along the tier (level) 10b, and is electrically coupled with sense-amplifier-circuitry (SA) 18 within the base 12 (i.e., the sense-amplifier-circuitry is associated with the base 12, or is otherwise supported by the base 12).

The digit line 16 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

Memory cells 14 are over the digit line 16. Each of the memory cells includes a transistor 30 coupled with a capacitor 32.

Each of the transistors 30 includes a vertically-extending channel-material-pillar 20 (only one of which is labeled), and gating structures (gating regions, transistor gates) 22 operatively proximate to the channel-material-pillar, with only a couple of the gating structures 22 being labeled in FIG. 3A.

The channel-material pillars 20 may comprise semiconductor material. The semiconductor material of the pillars 20 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15 of the periodic table).

Each of the pillars 20 comprises a channel region 15 between the gating regions 22, comprises an upper source/drain region 17 above the channel region, and comprises a lower source/drain region 19 beneath the channel region.

The upper and lower source/drain regions may be coupled to one another through the channel regions during operation of the transistors 30. Specifically, the gating regions 22 may be coupled to wordlines WL1-WL4. The wordlines (specifically, transistor gates along the wordlines) may be considered to be operatively adjacent to (operatively proximate to) the channel regions such that a sufficient voltage applied to an individual wordline will induce an electric field which enables current flow through an associated channel region to electrically couple the source/drain regions on opposing sides of the associated channel region with one another. If the voltage to the wordline is below a threshold level, the current will not flow through the channel region, and the source/drain regions on opposing sides of the channel region will not be electrically coupled with one another. The selective control of the coupling/decoupling of the source/drain regions through the level of voltage applied to the wordline may be referred to as gated coupling of the source/drain regions.

The gating regions 22 may be considered to be spaced from the channel-material-pillars 20 by gate dielectric material 28. The gate dielectric material may comprise any suitable composition(s), such as, for example, one or more of silicon dioxide, aluminum oxide, hafnium oxide, etc.

Although two of the gating regions 22 are shown to be associated with each of the transistors 30, in other embodiments the gating regions may be provided in other configurations. For instance, there may be only one gating region within a transistor and along one side of a channel-material pillar. As another example, the gating regions may extend entirely around the channel-material-pillars 20 in gate-all-around configurations.

In the illustrated embodiment, electrical flow along the channel region of one of the transistors 30 enables a capacitor 32 above the channel region to be electrically coupled with the digit line 16 below the channel region.

The capacitors (capacitive units) 32 each include a storage electrode 23, a plate electrode 24 and an insulative material (capacitor dielectric material) 26 between the electrodes 23 and 24.

The electrodes 23 and 24 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The insulative material 26 may comprise any suitable composition(s), and in some embodiments may comprise one or more of silicon dioxide, aluminum oxide, silicon nitride, hafnium oxide, etc.

Insulative material 25 extends around the gating regions 22. The insulative material 25 may comprise any suitable composition(s), and may, for example, comprise, consist essentially of, or consist of silicon dioxide. The insulative material 25 may be the same as the gate dielectric material 26 in some applications, and may be different than the gate dielectric material 26 in other applications.

The memory cells 14 may be incorporated into any suitable memory, and in some embodiments may correspond to DRAM (dynamic random-access memory) cells.

Figure 3B:
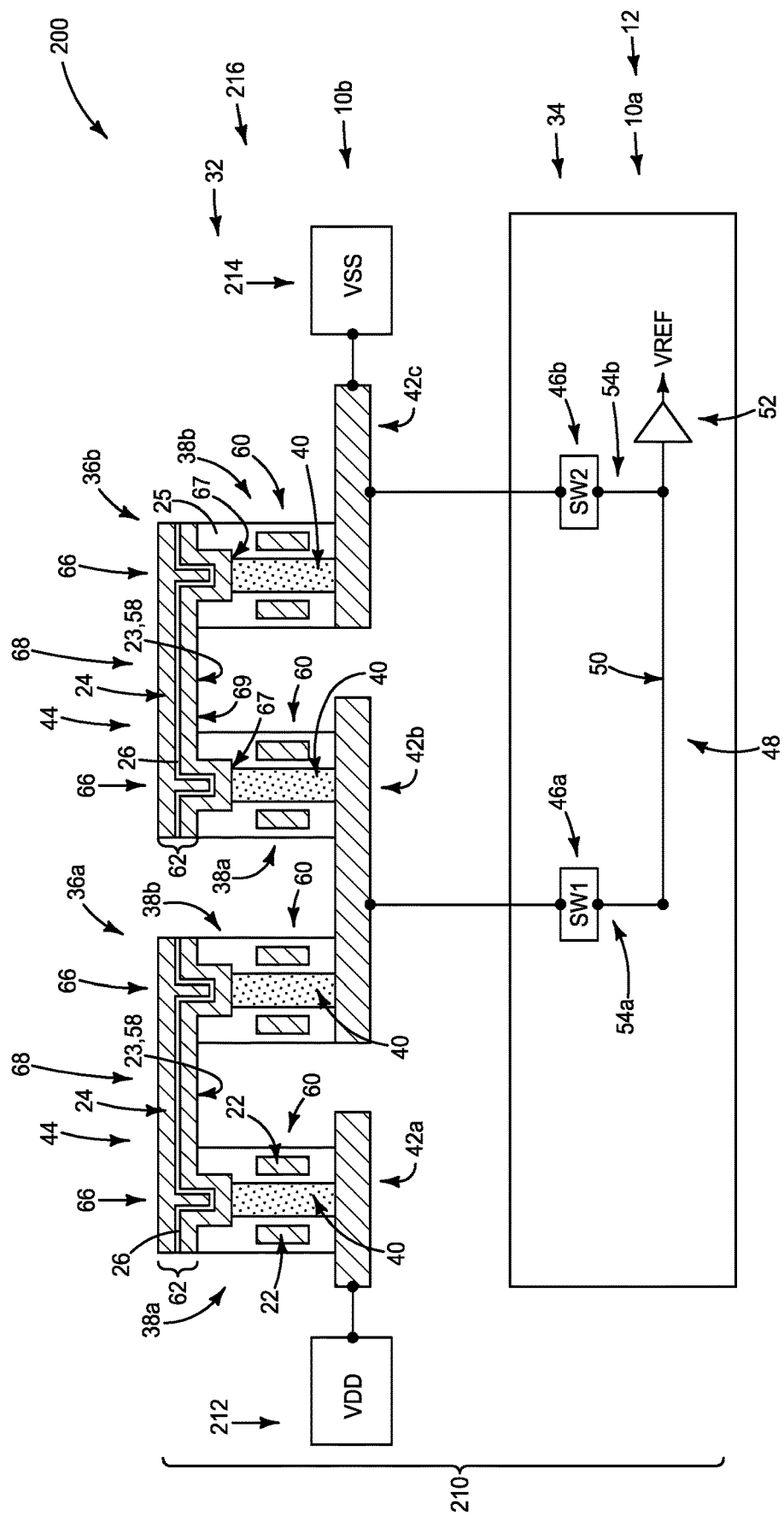
FIG. 3B is a diagrammatic side view of an example reference-voltage-generator.
Figures 1, 3B:
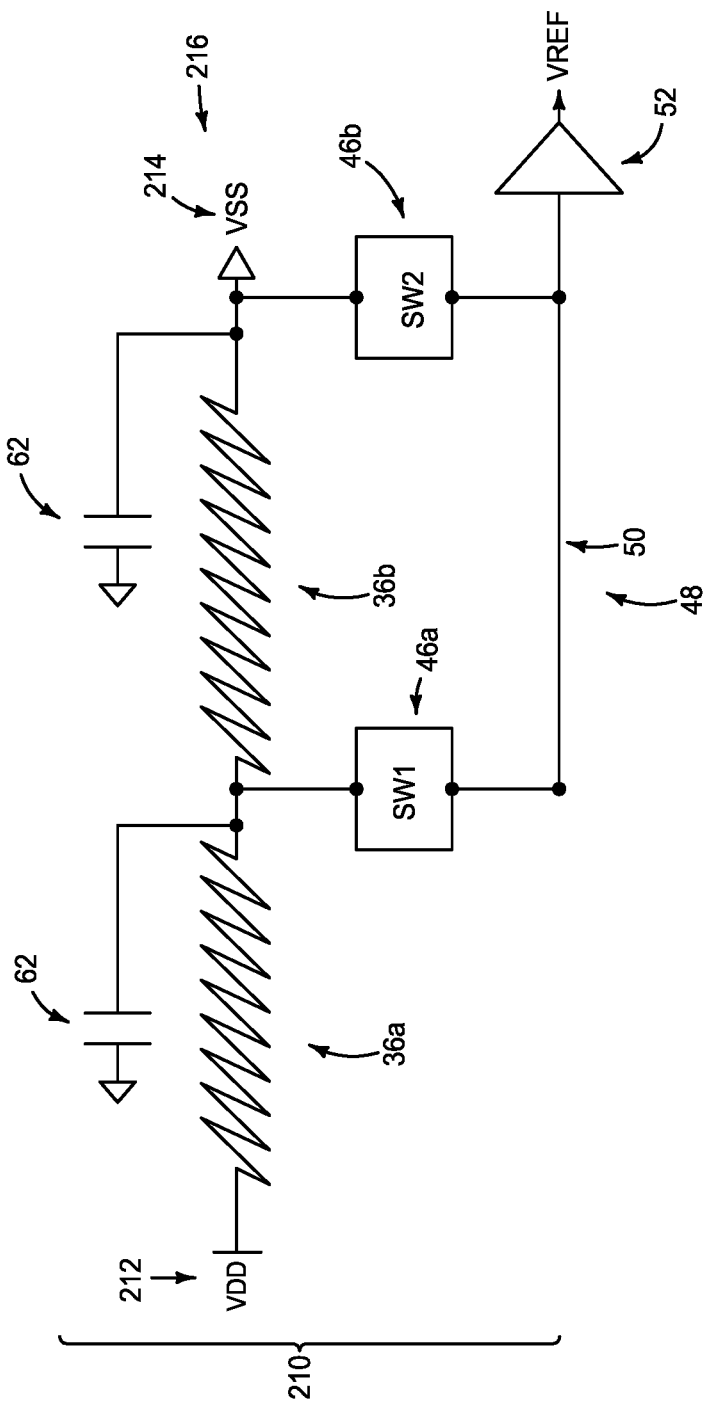

FIG. 3B shows an example embodiment of a reference-voltage-generator 210, with such reference-voltage-generator utilizing modified memory cells 14 from the memory tier 10b of FIG. 3A.

The reference-voltage-generator 210 is formed within the integrated assembly 200. The reference-voltage-generator 210 comprises an upper portion 32 along the tier 10b, and comprises a lower portion 34 associated with the base 12 (tier 10a). The lower portion 34 is under the tier 10b, and in some embodiments may be considered to be supported by semiconductor material of the base 12, which may include embodiments in which the lower portion comprises components which extend into semiconductor material of the base 12.

The upper portion comprises resistive components 36 (labeled as 36a and 36b). Each of the resistive components includes a pair of resistive units 38a and 38b. The resistive units 38a and 38b include vertically-extending pillars 40 analogous to the pillars 20 of the memory cells 14 (FIG. 3A).

The gating regions 22 are adjacent to the pillars 40. The gating regions 22 of FIG. 3B may have the same configurations and compositions as the gating regions 22 of the memory cells 14 (FIG. 3A).

The resistive units 38a and 38b are supported by conductive segments 42 (labeled 42a, 42b and 42c). Such conductive segments may comprise the same material as the digit line 16 of FIG. 3A, and may correspond to chopped regions of such digit line material. The conductive segments 42 may be supported by insulative materials of the deck 10b. Such insulative materials are not shown in order to simplify the drawing.

Interconnecting units 44 extend across the resistive units 38a and 38b and electrically couple such units to one another (i.e., to short the adjacent resistive units 38a and 38b to one another) to form the resistive components 36. In some embodiments, the interconnecting units 44 may be considered to replace the capacitive units 32 of the memory cells 14 (FIG. 3A). In some embodiments, each of the resistive components 36 may be considered to comprise a pair of adjacent (neighboring) resistive units 38a and 38b which are directly interconnected to one another through an interconnecting unit 44.

In some embodiments, the resistive units 38a and 38b may be referred to as first and second resistive units, respectively, within the components 36, and in the shown embodiment are formed in electrical series with one another. Additionally, the illustrated components 36a and 36b are formed in electrical series with one another.

The resistive components 36 may be referred to as a first resistive component 36a and a second resistive component 36b. The resistive components 36a and 36b are provided between a VDD supply terminal 212 and a VSS supply terminal 214, and may be considered to be analogous to the components 1002 described above with reference to FIG. 1.

A resistor-divider-circuit (resistance-supply-circuit, voltage-divider-circuit) 216 may be considered to comprise the resistive components 36, conductive segments 42 and interconnecting units 44.

The conductive segments 42 may be considered to correspond to conductive interconnects 42a, 42b and 42c. In some embodiments, the interconnect 42b may be referred to as a first conductive interconnect which couples the first resistive component 36a in series to the second resistive component 36b. The interconnect 42a may be referred to as a second conductive interconnect between the VDD supply terminal 212 and the first resistive component 36a, and the interconnect 42c may be referred to as a third conductive interconnect between the second resistive component 36b and the VSS supply terminal.

Although the illustrated embodiment comprises two of the resistive components 36, in other embodiments there may be many more of the resistive components provided within the reference-voltage-generator 210. Accordingly, the may be many more of the conductive interconnects besides the illustrated interconnects 42a-c.

In some embodiments, the resistive units 38 may each be considered to include a vertically-extending pillar 40 of first material (e.g., channel material), and to comprise an interconnecting unit 44 over the pillar and electrically coupled with the pillar. The interconnecting units include first regions 66 directly over the pillars, and second regions 68 laterally offset from the first regions. The first regions 66 have bottommost (lowermost) surfaces 67, while the second regions have bottommost surfaces 69. In the illustrated embodiment, the lowermost surfaces 67 are beneath the lowermost surfaces 69.

The pillars 40 extend upwardly from the conductive segments 42. Some adjacent resistive units 38 are electrically coupled to one another through the conductive segments (specifically, the units 38 from neighboring resistive structures 36), while other adjacent resistive units are electrically coupled one another through the interconnecting units 44 (specifically, the units 38 within the same resistive structures 36 as one another). In the illustrated embodiment, the resistive components 36a and 36b may be considered to be provided in a line between the VDD and VSS supply terminals, and the coupling through the conductive segments 42 and the interconnecting units 44 alternates one after another along the line of the resistive components.

Switches 46 are provided associated with the base 12 (with the term "associated with the base" meaning that such switches are supported by the base, and may or may not have components extending into semiconductor material of the base). In the illustrated embodiment, the switches 46 correspond to a first switch SW1 (46a) and a second switch SW2 (46b). The first switch 46a is coupled to the conductive interconnect 42b, and the second switch 46b is coupled to the conductive interconnect 42c. The switches 46 may be analogous to the switches 1008 described above with reference to FIG. 1. Although only two switches 46 are shown, in other embodiments may be more than two switches if there are more than two of the resistive components 36.

An output circuit 48 is provided to be associated with the base 12. The output circuit includes an electrical feed 50 which provides input to a gain buffer 52. A first feed interconnect 54a extends from the first switch 46a to the electrical feed 50, and a second feed interconnect 54b extends from the second switch 46b to the electrical feed 50.

A reference voltage (VREF) is output from the gain buffer. The reference voltage may be analogous to the reference voltage described above with reference to FIG. 1.

In some embodiments, it is recognized that the pillars 40 and gating regions 22 may be considered to be incorporated into transistors 60 analogous to the transistors 30 of FIG. 3A. However, it may be desired that the transistors 60 are configured to be always in an ON operational mode. Accordingly, the pillars 40 may comprise conductive material, and in some embodiments may comprise heavily-doped channel material. The channel material may be the same as that utilized in the pillars 20 of the memory cells (FIG. 3A), but the heavy doping may effectively make the pillars 40 sufficiently conductive so that the transistors 60 are effectively always ON. Alternately, the pillars 40 may comprise semiconductor material which is depletion doped (e.g., p-type doped silicon), and the gating regions 22 may be electrically grounded so that the transistors 60 are effectively always ON.

The interconnecting units 44 comprise the capacitor dielectric material 26, the upper electrodes (plate electrodes) 24 and the storage node electrodes (storage electrodes) 23, with the storage node electrodes providing electrical coupling between the resistive units 38a and 38b. In some embodiments, the fused storage node structures 23 of the resistive components 36 may be considered to correspond to conductive structures (conductive segments) 58 provided in place of the storage node electrodes 23 of the memory cells 14 (FIG. 3A). In some embodiments, the conductive segments 58 may be referred to as second conductive segments to distinguish them from the first conductive segments 42.

The capacitor dielectric material 26, conductive structures 58 and plate electrodes 24 together comprise capacitive components (capacitive elements, capacitors) 62 coupled with the resistive components 36.

Figure 1:
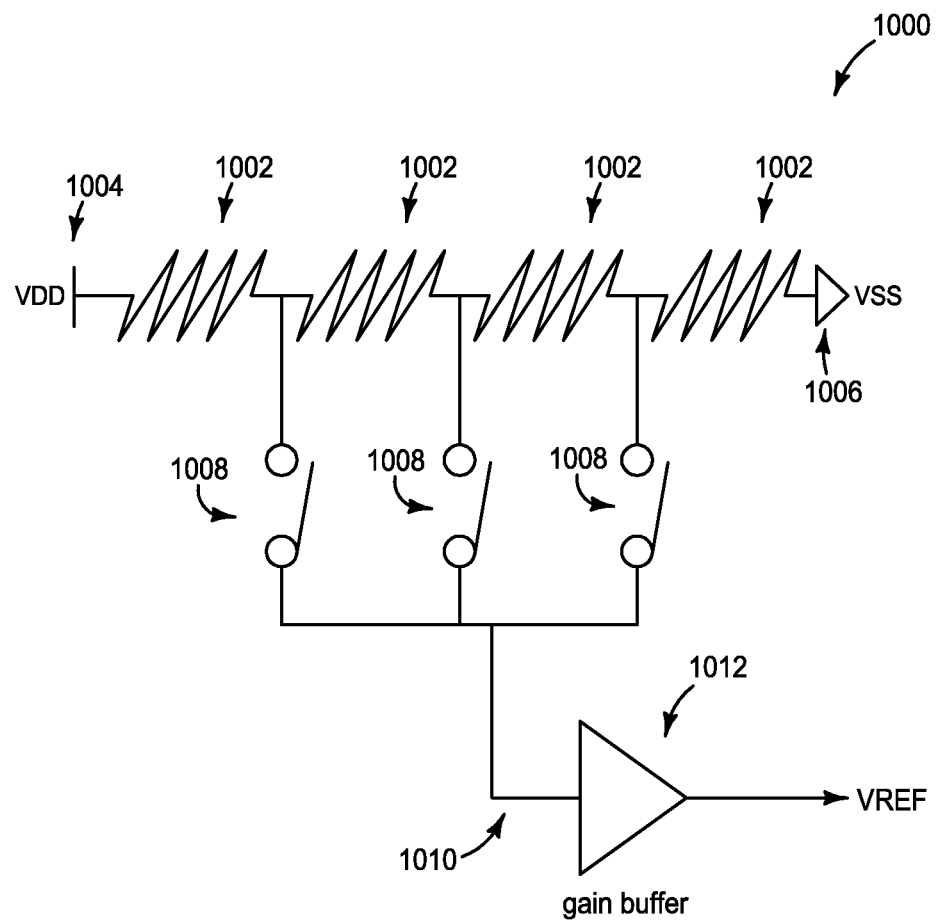
FIG. 1 is a schematic diagram of a prior art reference-voltage-generator.

FIG. 3B-1 schematically illustrates the reference-voltage-generator 210 described above with reference to FIG. 3B.

Figure 3C:
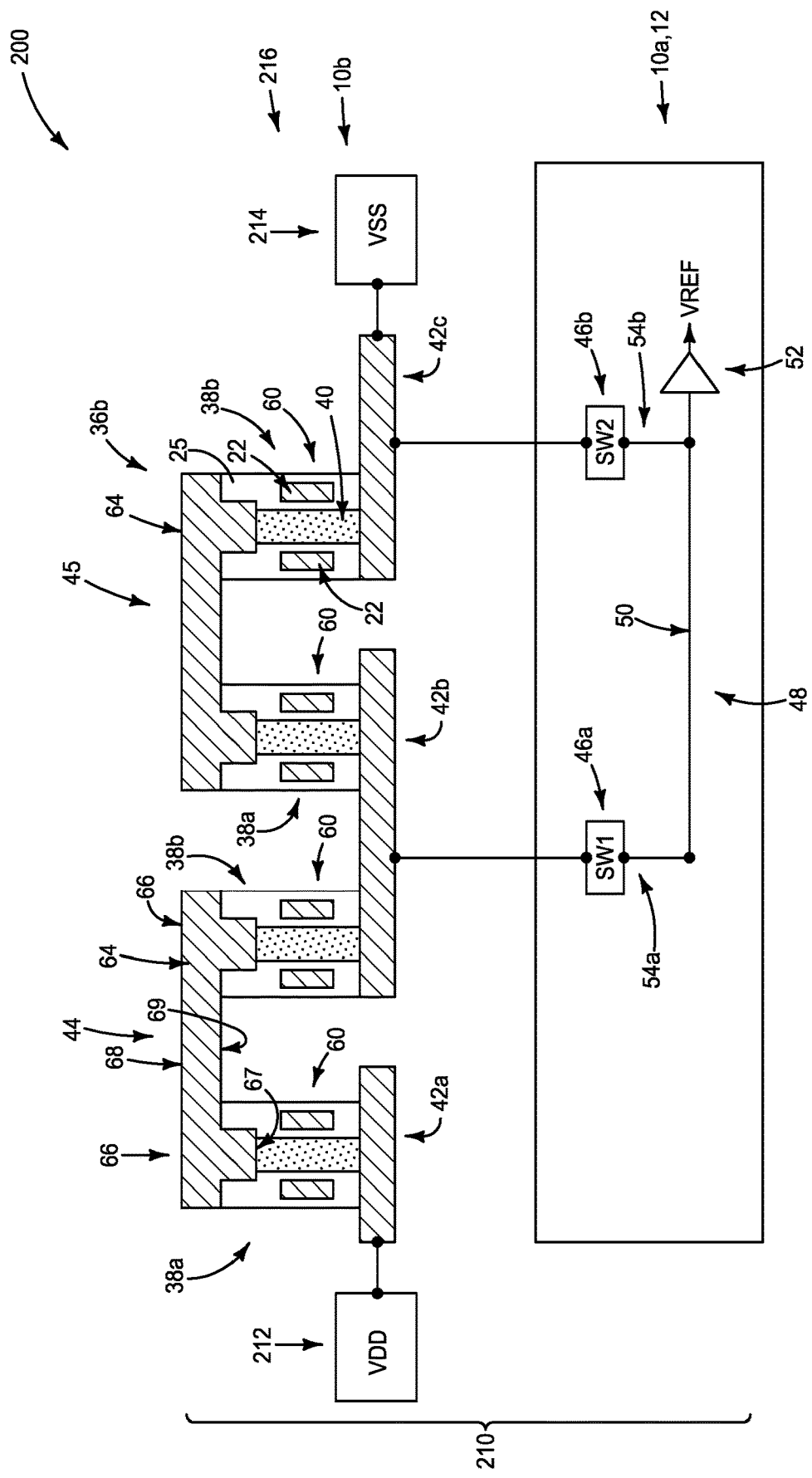
FIG. 3C is a diagrammatic side view of an example reference-voltage-generator.
Figures 1, 3C:
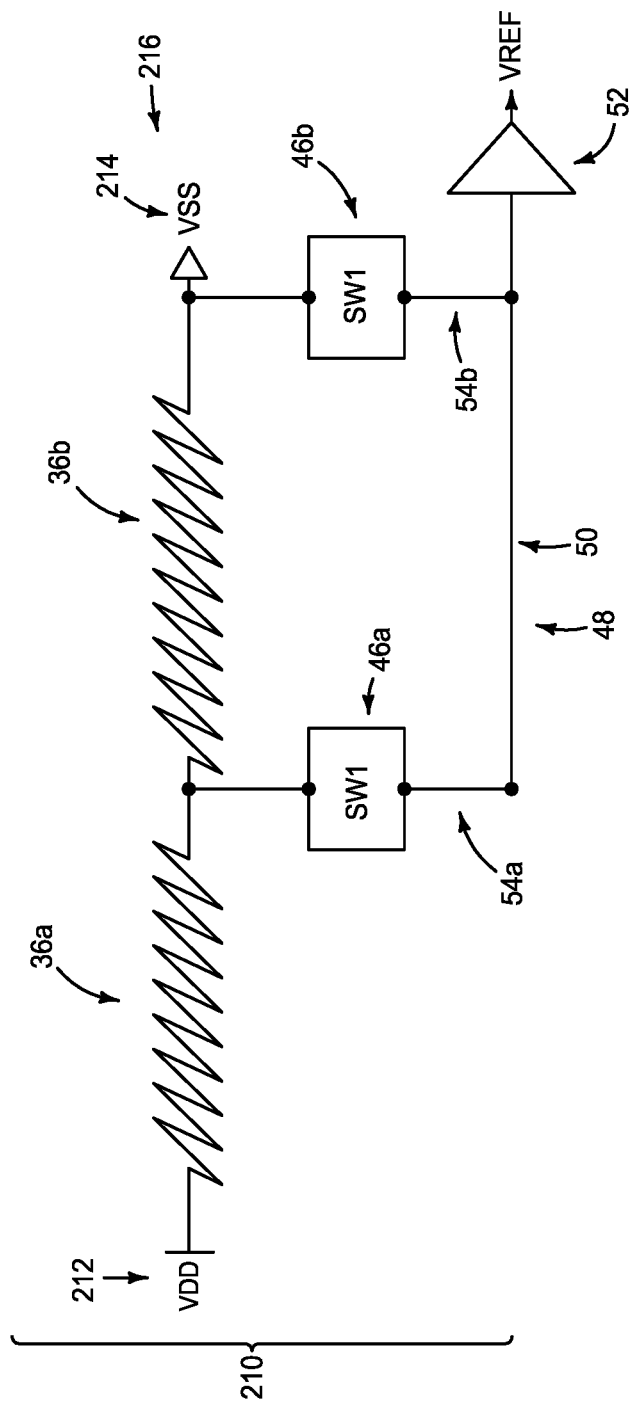

The capacitors 62 associated with the capacitive units 36 of the embodiment of FIGS. 3B and 3B-1 may advantageously alleviate undesired voltage fluctuation associated with the reference-voltage-generator 210. In other embodiments, the capacitors 62 may be omitted. For instance, FIG. 3C shows a reference-voltage-generator 210 analogous to that of FIG. 3B, but in which the interconnecting units 44 comprise conductive structures 64 in place of the structures 58 and 24 of FIG. 3B. In some embodiments, the conductive structures 64 may be considered to be conductive blocks which replace the storage node electrodes 23, the capacitor dielectric material 26 and the plate electrodes 24 of the memory cells 14 (FIG. 3A).

The conductive structures 64 may be compositionally homogeneous (as shown) or may comprise laminates of two or more different compositions. In some embodiments, the dielectric material 26 (FIG. 3B) may be omitted to form the conductive structures 64. In other embodiments, the dielectric material may be treated so that it becomes leaky and/or conductive.

FIG. 3C-1 schematically illustrates the reference-voltage-generator 210 of FIG. 3C.

The embodiments of FIGS. 3B and 3C show a same number of resistive components associated with each of the feed interconnects 54. In other embodiments, there may be a different number of resistive components associated with one of the feed interconnects than are associated with another of the feed interconnects. For instance, FIG. 3D shows an example embodiment in which the feed interconnects 54a, 54b, 54c and 54d are coupled with the conductive segments 42b, 42d, 42e and 42f, respectively; and in which single resistive components 36 are coupled to three of the feed interconnects (specifically, the three interconnects 54a, 54c and 54d), while a pair of resistive components 36 (specifically, 36b and 36c) are coupled with the fourth of the feed interconnects (specifically, the feed interconnect 54b).

The embodiments of FIGS. 3B and 3C having a same number of components associated with each of the feed interconnects may be advantageous in some applications in which it is desired to have the same amount of resistance between all of the switches 46. In contrast, the embodiment of FIG. 3D may be advantageous in applications in which it is desired to have a large amount of resistance associated with one or more of the switches 46, and smaller amounts of resistance associated with others of the switches. The embodiment of FIG. 3D may enable resistance across individual switches within a reference-voltage-generator to be individually tailored for specific applications.

Figure 3D:
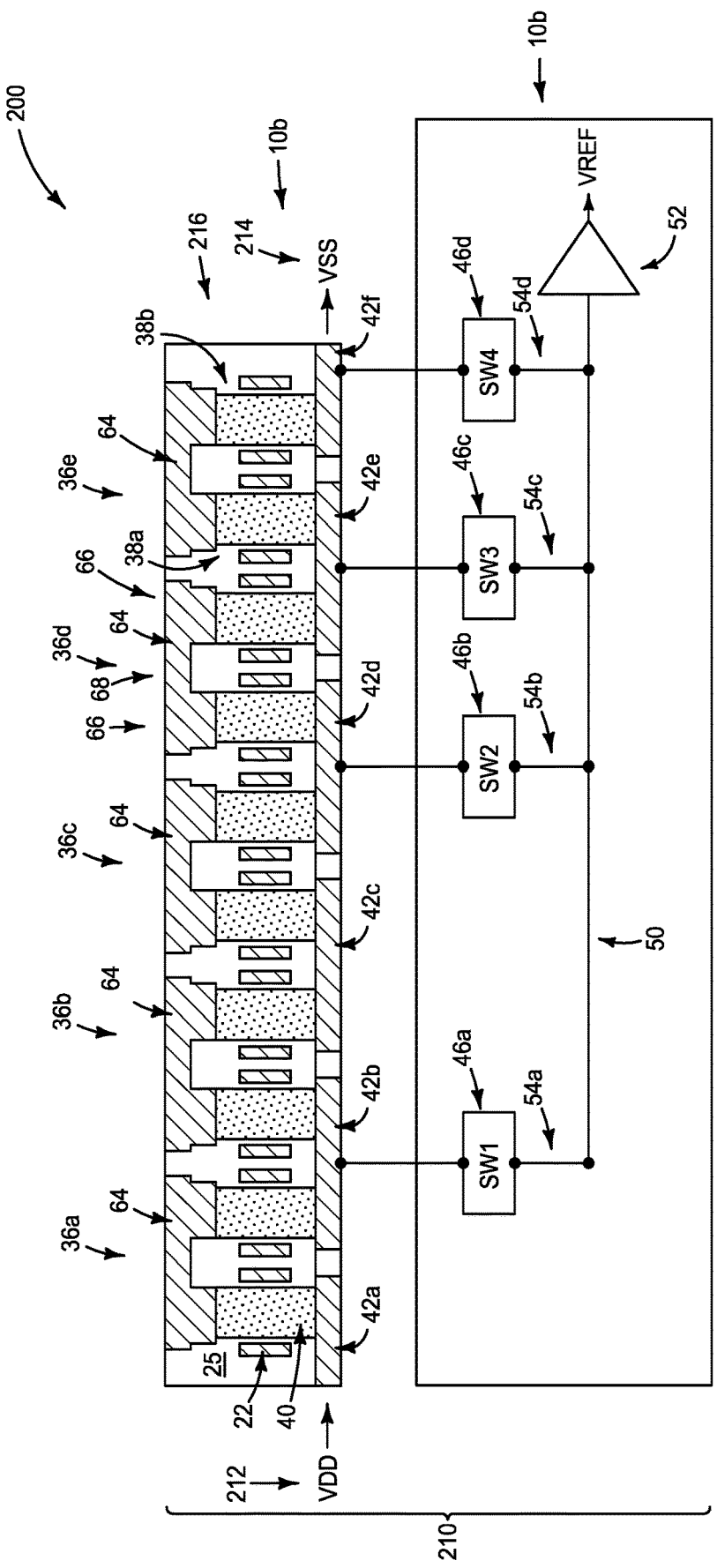
FIG. 3D is a diagrammatic side view of an example reference-voltage-generator.

The multi-deck assembly of FIG. 2 may include memory cells of the type shown in FIG. 3A along one or more of the decks 10b-10e, and may comprise any of the reference-voltage-generators of FIGS. 3B, 3C and 3D associated with the lower deck 10b and the base 12 (deck 10a). Although the multi-deck assembly is shown to have four decks over the base 12, in other embodiments the multi-deck assembly may have a different number of decks over the base. Generally, the multi-deck assembly will comprise at least one deck over the base 12.

Figure 4A:
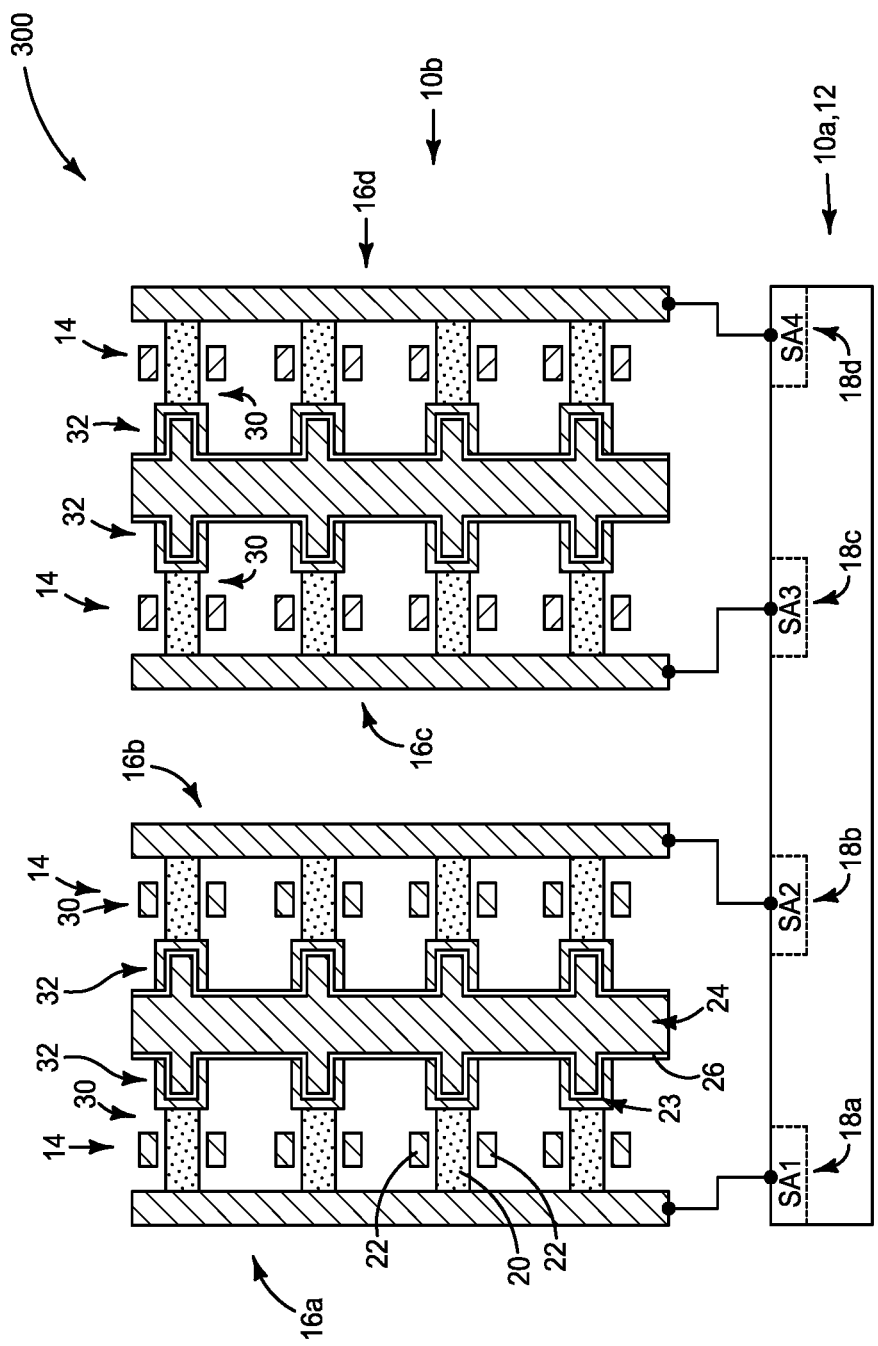
FIG. 4A is a diagrammatic side view of an example arrangement of memory cells within a multi-deck assembly.

FIG. 4A shows a portion of an integrated assembly 300 comprising another arrangement of memory cells 14 associated with a memory deck 10b over a base 12 (tier 10a). The illustrated memory cells comprise transistors 30 and capacitors 32 analogous to those described above with reference to FIG. 3A. However, the illustrated transistors and capacitors of FIG. 4A extend horizontally (laterally) rather than vertically. The transistors comprise the channel material 20 described above with reference to FIG. 3A, and comprise the gating regions 22. The gating regions may be along wordlines that extend in and out of the page relative to the cross-sectional view of FIG. 4A.

The capacitors comprise the storage nodes 23, the capacitor dielectric material 26 and the plate electrodes 24. In the embodiment of FIG. 4A, the plate electrode 24 is shared between capacitors on a first side of the plate electrode (an illustrated left side), and capacitors on an opposing second side of the plate electrode (an illustrated right side).

Digit lines 16a-d extend vertically along the memory cells 14, and are coupled with sense amplifier circuitry 18a-d (SA1 through SA4) associated with the base 12.

Figure 4B:
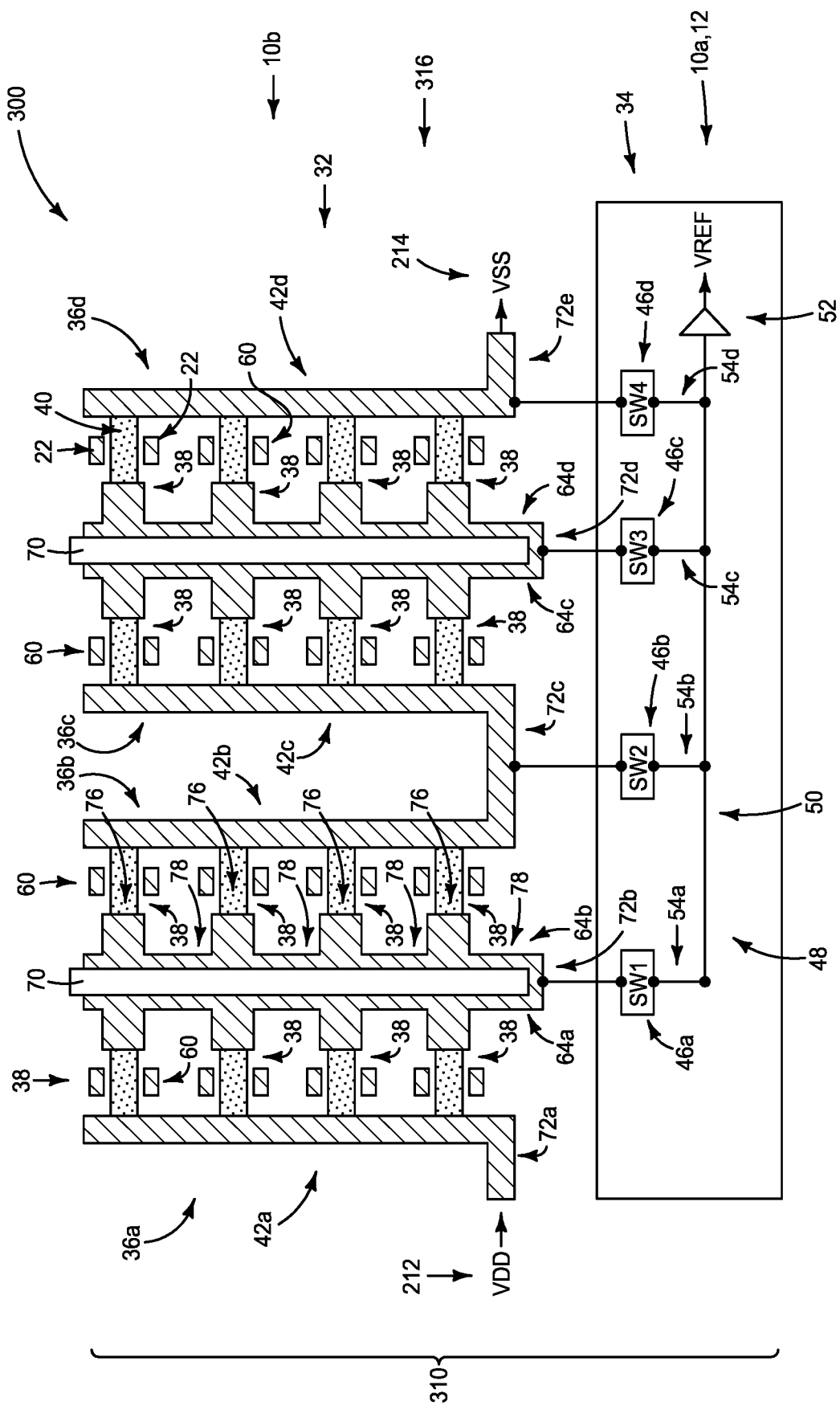
FIG. 4B is a diagrammatic side view of an example reference-voltage-generator.
Figures 1, 4B:
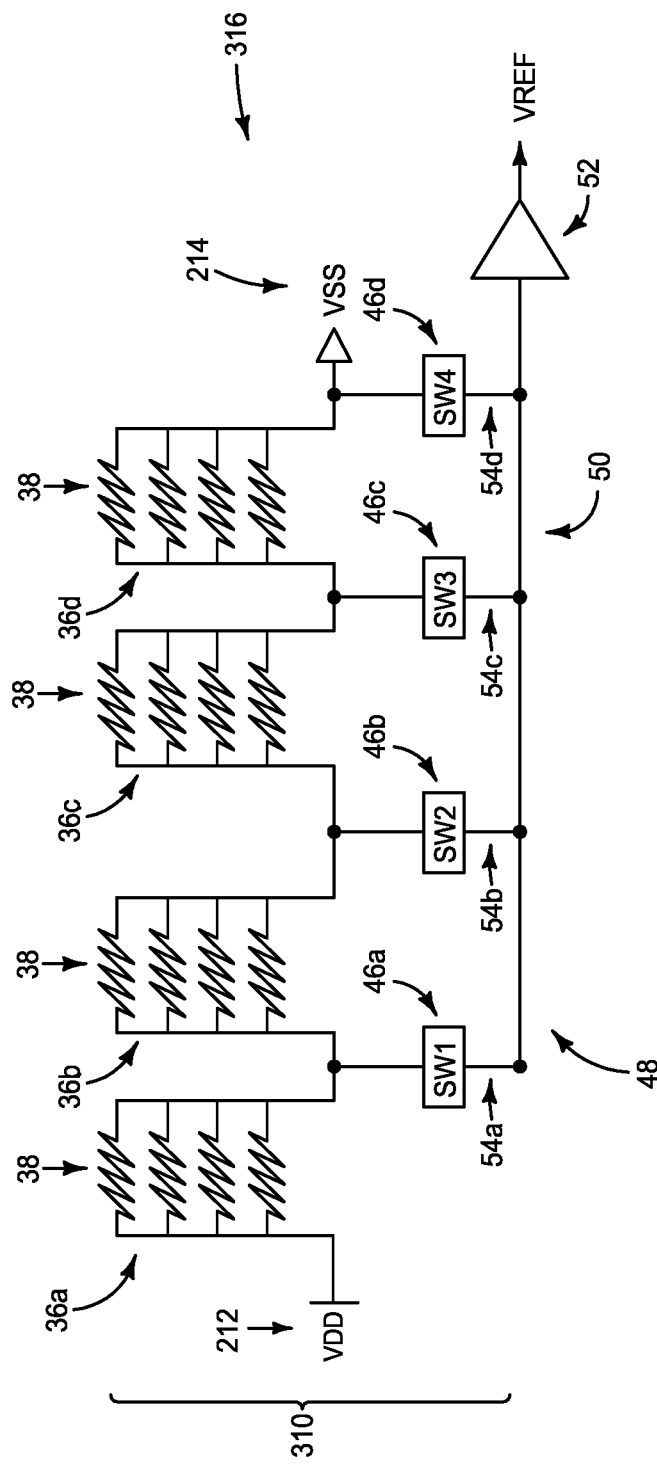

FIG. 4B shows an example embodiment of a reference-voltage-generator 310, with such reference-voltage-generator utilizing modified memory cells 14 from the memory tier 10b of FIG. 4A.

The reference-voltage-generator 310 comprises an upper portion 32 along the tier 10b, and comprises a lower portion 34 associated with the base 12 (tier 10a). The lower portion 34 is under the tier 10b, and in some embodiments may be considered to be supported by semiconductor material of the base 12.

The upper portion comprises resistive components (resistive groupings) 36a-d. Although four resistive groupings are shown, in other embodiments there may be more than four resistive groupings or less than four resistive groupings. Generally, there will be at least two of the resistive groupings 36. In some embodiments, the illustrated resistive groupings 36a-d may be referred to as first, second, third and fourth resistive groupings, respectively.

Each of the resistive groupings 36 includes a number of resistive units 38 arranged in parallel relative to one another. The resistive units 38 include horizontally-extending pillars 40, and gating regions 22 adjacent to the pillars 40. The gating regions 22 of FIG. 4B may have the same configurations and compositions as the regions 22 of the memory cells 14 (FIG. 4A). The pillars 40 may comprise any of the compositions described above relative to the pillars 40 of FIG. 3B.

The resistive units 38 are laterally between first vertically-extending conductive segments 42 and second vertically-extending conductive segments 64. The conductive segments 42 are analogous to the digit lines 16 of FIG. 4A, and the segments 64 replace the storage node electrodes 23, capacitor dielectric material 26 and plate electrodes 24 of the capacitors 32. In some embodiments, the segments 64 may be considered to correspond to interconnecting units analogous to the interconnect units 44 of FIG. 3B.

In some embodiments, the segments 42 and 64 may be referred to as first and second vertically-extending segments, respectively. The illustrated second segments 64 comprise wide regions 76 and narrow regions 78 which alternate with one another along a vertical direction. The pillars 40 are horizontally aligned with the wide regions 76. The illustrated first segments 42 maintain a substantially uniform width along the entire vertical expanse of such first segments.

In the shown embodiment, the first and second segments 42 and 64 are arranged in a repeating pattern which includes a pair of the second segments (e.g., 64a and 64b) between a pair of the first segments (e.g., 42a and 42b).

In the illustrated embodiment, insulative material 70 is provided to split the plate electrodes 24 into the vertically-extending conductive segments 64. The insulative material 70 may comprise any suitable composition(s), and in some embodiments may comprise one or more of silicon dioxide, silicon nitride, aluminum oxide, etc.

The conductive interconnects (conductive segments) 72 a-e are provided to couple the various segments 42 and 64 with one another, and to couple the outer segments 42 with the supply terminals 212 and 214. In the shown embodiment, the conductive interconnect 72b may be considered to be a first conductive interconnect which couples the first resistive grouping 36a in series with the second resistive grouping 36b. The conductive interconnect 72a may be considered to be a second conductive interconnect which is between the VDD supply terminal 212 and the first resistive grouping 36a. Any of the interconnects 72c-e may be considered to be a third conductive interconnect between the second resistive grouping 36b and the VSS supply terminal 214.

In some embodiments, the segments 72 which interconnect neighboring vertically-extending segments 42 with one another may be referred to as first interconnecting segments which join laterally adjacent first segments 42 with one another, and the segments 72 which interconnect neighboring vertically-extending segments 64 with one another may be referred to as second interconnecting segments which join laterally adjacent second segments 64 with one another. Thus, the segment 72c is an example of a first interconnecting segment, and the segment 72b is an example of a second interconnecting segment.

Switches 46a-d (SW1 through SW4) are associated with the base 12 and are coupled with the interconnects 72b-e. Although four switches are shown, there may be more than four switches or less than four switches. Generally, there will be at least two of the switches 46 associated with the base 12.

An output circuit 48 is provided to be associated with the base 12. The output circuit includes an electrical feed 50 which provides input to a gain buffer 52. Feed interconnects 54a-d extend from the switches 46a-d, respectively, to the electrical feed 50.

A reference voltage (VREF) is output from the gain buffer. The reference voltage may be analogous to the reference voltage described above with reference to FIG. 1.

The pillars 40 and gating regions 22 may be incorporated into transistors 60 analogous to the transistors described above with reference to FIG. 3B, and may be appropriately configured to be always in an ON operational mode. Such configuration may include any of the approaches described above with reference to FIG. 3B.

In some embodiments, a resistor-divider-circuit (resistance-supply-circuit, voltage-divider-circuit) 316 may be considered to comprise the resistive components 36, the conductive segments 42 and 64, and the interconnecting units 72. Such resistor-divider-circuit (resistance-supply-circuit, voltage-divider-circuit) is associated with the deck 10b.

FIG. 4B-1 schematically illustrates the reference-voltage-generator 310 described above with reference to FIG. 4B. Such shows the resistive units 38 arranged in parallel relative to one another, with each of the resistive components 36 comprising a plurality of the resistive units 38. The schematic illustration of FIG. 4B-1 also shows that the resistive components 36 are arranged in series relative to one another.

Although the illustrated configuration comprises four tiers of the resistive units 38, it is to be understood that in other embodiments there may be a different number of tiers of the resistive units 38. For instance, in some embodiments there may be eight tiers of the resistive units 38 within each of the resistive components 36, 16 tiers, 32 tiers, 64 tiers, etc.

Figure 4C:
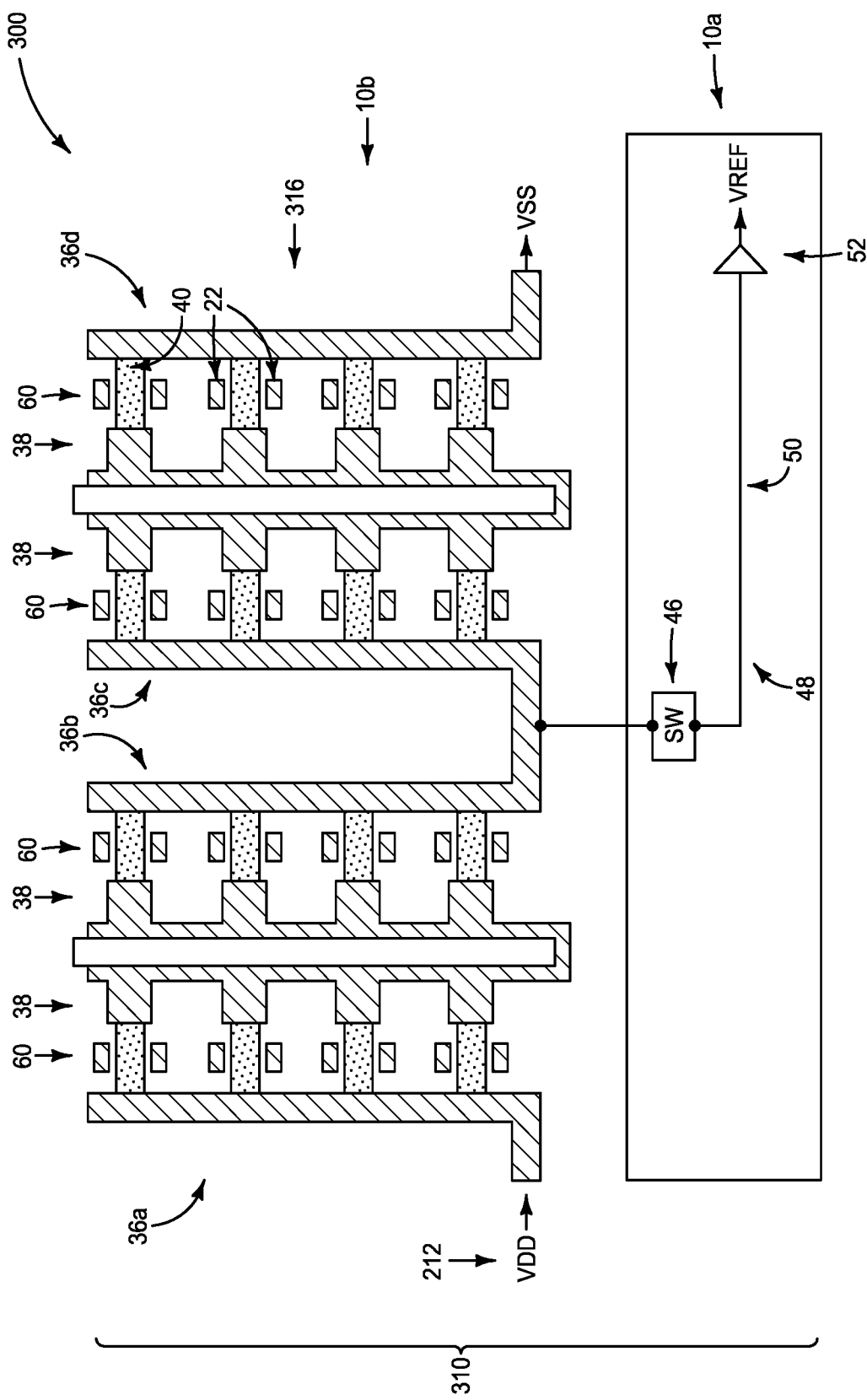
FIG. 4C is a diagrammatic side view of an example reference-voltage-generator.
Figures 1, 4C:
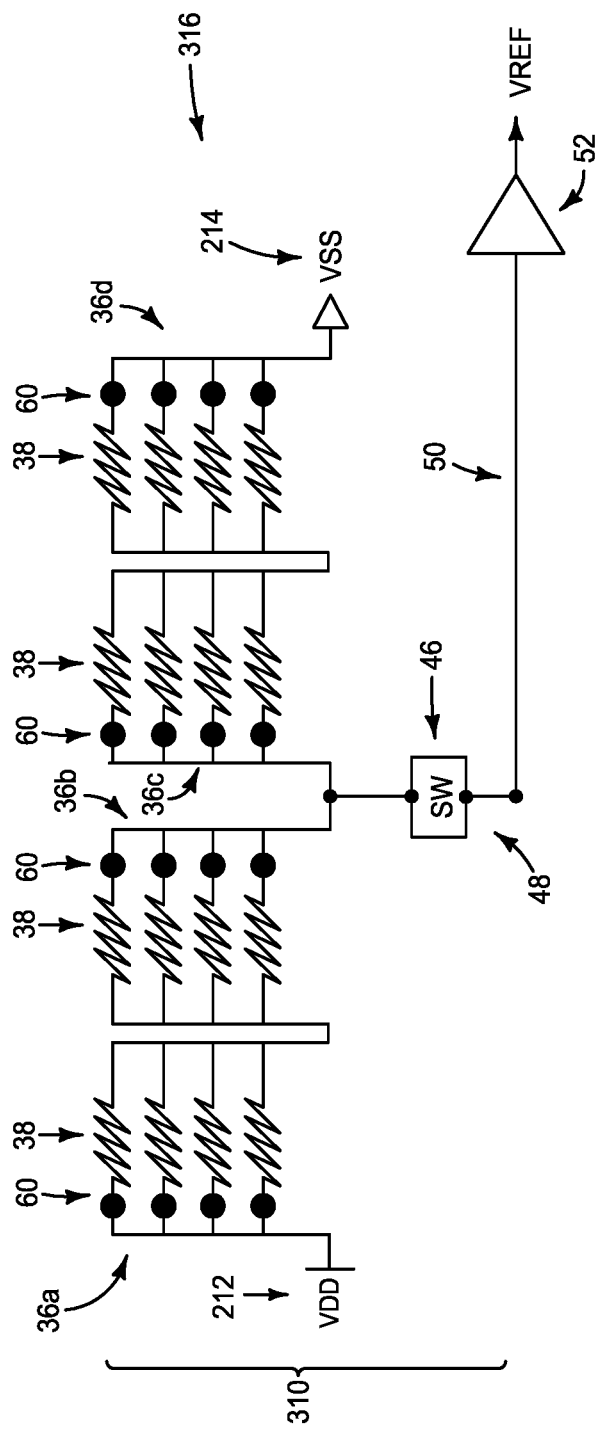

In some embodiments, the transistors 60 may be utilized to control electrical flow to individual resistive units 38 (i.e., may be utilized as switches controlling flow to the individual resistive units). Accordingly, the pillars 40 may comprise the same channel material as is utilized in the memory cells 14 of FIG. 4A, and such channel material may be gated utilizing the gating regions 22. FIG. 4C shows an example configuration in which the transistors 60 are configured to be utilized as switches for controlling electrical operation of the resistive units 38. In such configuration, most of the switches 46 associated with the configuration of FIG. 4B may be omitted from the base region 12. Instead, only a single switch 46 is provided, and such is simply used to either connect the resistive structure 316 with the gain buffer 52, or to disconnect the resistive structure 316 from the gain buffer. The switch 46 of FIG. 4C is optional, and may be omitted in some applications.

FIG. 4C-1 schematically illustrates the reference-voltage-generator 310 described above with reference to FIG. 4C. Dark regions are provided to illustrate that the transistors 60 are active transistors controlling electrical flow through the resistive units 38.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not. The term "substantially vertical" means vertical to within reasonable tolerances of fabrication and measurement. In some embodiments, vertically-extending structures may extend to within ±10° of vertical relative to a horizontal surface of an underlying base.

Structures (e.g., layers, materials, etc.) may be referred to as "extending horizontally" to indicate that the structures generally along a same direction as a horizontal upper surface of underlying base (e.g., substrate). The horizontally-extending structures may extend substantially parallel relative to an upper surface of the base, or not. The term "substantially parallel" means parallel to within reason will tolerances of fabrication and measurement. In some embodiments, horizontally-structures may extend to within ±10° of vertical relative to a horizontal surface of an underlying base.

Some embodiments include an integrated assembly having a deck over a base, and having memory cells supported by the deck. Each of the memory cells includes a capacitive unit and a transistor. The individual capacitive units of the memory cells each have a storage node electrode, a plate electrode, and a capacitor dielectric material between the storage node electrode and the plate electrode. A reference-voltage-generator includes resistive units supported by the deck. The resistive units are similar to the memory cells but include interconnecting units in place of the capacitive units. The interconnecting units of some adjacent resistive units are shorted to one another.

Some embodiments include an integrated assembly comprising a deck over a base. Resistor-divider-circuitry (resistance-supply-circuitry, voltage-divider-circuitry) extends from a VDD supply terminal to a VSS supply terminal and is supported by the deck. The resistor-divider-circuitry (resistance-supply-circuitry, voltage-divider-circuitry) includes resistive units. Each of the resistive units includes a vertically-extending pillar of first material and an interconnecting unit over the pillar and electrically coupled with the pillar. Each of the interconnecting units includes a first region directly over the pillar and a second region laterally offset from the first region. The first region has a lower bottommost surface than the second region. The pillars extend upwardly from conductive segments. Some adjacent resistive units are electrically coupled to one another through the conductive segments and some neighboring resistive units are electrically coupled to one another through the interconnecting units. An output circuit is associated with the base. The output includes an electrical feed coupled to a gain buffer, and includes a reference voltage output from the gain buffer. At least two feed interconnects extend from the resistor-divider-circuitry to the electrical feed. Switches are along the feed interconnects.

Some embodiments include an integrated assembly comprising a deck over a base. Resistor-divider-circuitry extends from a VDD supply terminal to a VSS supply terminal and is supported by the deck. The resistor-divider-circuitry includes vertically-extending segments and resistive units extending horizontally between the vertically-extending segments. The vertically-extending segments include first segments and second segments. The second segments comprise vertically-alternating wide regions and narrow regions. The resistive units each includes a horizontally-extending pillar of first material. The pillars of first material extend from the first segments to the second segments and are horizontally aligned with the wide regions of the second segments. An output circuit is associated with the base. The output includes an electrical feed coupled to a gain buffer, and includes a reference voltage output from the gain buffer. At least one feed interconnect extends from the resistor-divider-circuitry to the electrical feed.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a deck over a base;
   memory cells supported by the deck; each of the memory cells including a capacitive unit and a transistor comprising a transistor structure having a vertically extending semiconductor material pillar comprising a channel region between an upper source/drain region and a lower source drain region; the individual capacitive units of the memory cells each comprising a storage node electrode comprising a conductive structure electrically coupled to the upper source/drain region of the transistor structure, a plate electrode, and a capacitor dielectric material between the storage node electrode and the plate electrode; and
   a reference-voltage-generator which includes resistive units supported by the deck; the resistive units each comprising the transistor structure and comprising interconnection units, the interconnection units comprising the conductive structure electrically coupled to the source/drain region of the transistor structure, at least two adjacent resistive units being shorted to one another through a conductive connection fusing the conductive structure of the at least two adjacent resistive units.

2. The integrated assembly of claim 1 wherein the resistive units are arranged in series relative to one another.

3. The integrated assembly of claim 1 wherein at least some of the resistive units are arranged in parallel relative to one another.

4. The integrated assembly of claim 1 wherein the interconnection units further comprise the capacitor dielectric material.

5. The integrated assembly of claim 1 wherein the interconnection units are conductive blocks.

6. The integrated assembly of claim 1 wherein:
   resistive components comprise resistive units directly interconnected to one another through the interconnecting units; there being at least two of the resistive components with one of the resistive components being a first resistive component and another of the resistive components being a second resistive component;
   a first conductive interconnect couples the first resistive component in series to the second resistive component;
   the resistive components are provided between a VDD supply terminal and a VSS supply terminal, with the first resistive component being closer to the VDD supply terminal than the second resistive component;

a second conductive interconnect is between the VDD supply terminal and the first resistive component, and a third conductive interconnect is between the second resistive component and the VSS supply terminal;

two or more switches are associated with the base; a first of the switches being coupled to the first conductive interconnect and a second of the switches being coupled to the third conductive interconnect; and an output circuit is associated with the base; the output including an electrical feed coupled to a gain buffer, and including a reference voltage output from the gain buffer; a first feed interconnect extending from the first switch to the electrical feed, and a second feed interconnect extending from the second switch to the electrical feed.

7. The integrated assembly of claim 1 wherein:

the resistive units are arranged in parallel relative to one another and are within a first resistive grouping;

the resistive grouping is one of two or more resistive groupings within the reference-voltage-generator; one of the resistive groupings being a first resistive grouping and another of the resistive groupings being a second resistive grouping;

a first conductive interconnect couples the first resistive grouping in series to the second resistive grouping;

the resistive groupings are provided between a VDD supply terminal and a VSS supply terminal, with the first resistive grouping being closer to the VDD supply terminal than the second resistive grouping;

a second conductive interconnect is between the VDD supply terminal and the first resistive grouping, and a third conductive interconnect is between the second resistive grouping and the VSS supply terminal;

two or more switches are associated with the base; a first of the switches being coupled to the first conductive interconnect and a second of the switches being coupled to the third conductive interconnect; and an output circuit is associated with the base; the output including an electrical feed coupled to a gain buffer, and including a reference voltage output from the gain buffer; a first feed interconnect extending from the first switch to the electrical feed, and a second feed interconnect extending from the second switch to the electrical feed.

8. The integrated assembly of claim 1 wherein:

the transistors of the memory cells being first transistors and the transistors of the resistive units being second transistors;

the resistive units are arranged in parallel relative to one another and are within a first resistive grouping;

the resistive grouping is one of two or more resistive groupings within the reference-voltage-generator; one of the resistive groupings being a first resistive grouping and another of the resistive groupings being a second resistive grouping;

a conductive interconnect couples the first resistive grouping in series to the second resistive grouping;

the resistive groupings are provided between a VDD supply terminal and a VSS supply terminal, with the first resistive grouping being closer to the VDD supply terminal than the second resistive grouping;

the second transistors are configured to operate as first switches to control operation of individual resistive units within the resistive groupings;

an output circuit is associated with the base; the output including an electrical feed coupled to a gain buffer, and including a reference voltage output from the gain buffer; and a feed interconnect extends from the electrical feed to the conductive interconnect.

9. The integrated assembly of claim 1 wherein the transistors of the resistive units are configured to be always in an ON mode.

10. The integrated assembly of claim 9 wherein the transistors of the resistive units include heavily-doped channel material.

11. The integrated assembly of claim 9 wherein the transistors of the resistive units include depletion-doped channel material; and wherein gating regions of the transistors of the resistive units are electrically grounded.

12. An integrated assembly, comprising:

a deck over a base;

memory cells supported by the deck; each of the memory cells including a capacitive unit and a transistor comprising a transistor structure comprising a semiconductor pillar containing a channel region extending horizontally between opposing source/drain regions; the individual capacitive units of the memory cells each comprising a storage node electrode comprising a conductive structure electrically coupled to a source/drain region of the transistor structure, a plate electrode, and a capacitor dielectric material between the storage node electrode and the plate electrode; and a reference-voltage-generator which includes resistive units supported by the deck; the resistive units each comprising the transistor structure and comprising interconnection units, the interconnection units comprising the conductive structure electrically coupled to the source/drain region of the transistor structure, at least two adjacent resistive units being shorted to one another through a conductive connection fusing the conductive structure of the at least two adjacent resistive units.

13. The integrated assembly of claim 12 wherein the resistive units are arranged in series relative to one another.

14. The integrated assembly of claim 12 wherein at least some of the resistive units are arranged in parallel relative to one another.

* * * * *